United States Patent [19]

Tain

[11] Patent Number: 6,041,269
[45] Date of Patent: Mar. 21, 2000

[54] INTEGRATED CIRCUIT PACKAGE VERIFICATION

[75] Inventor: Alexander C. Tain, Milpitas, Calif.

[73] Assignee: Advanced Micro Devices, Inc., Sunnyvale, Calif.

[21] Appl. No.: 08/909,463

[22] Filed: Aug. 11, 1997

[51] Int. Cl.[7] .................................................. G06F 19/00
[52] U.S. Cl. ........................................................... 700/121
[58] Field of Search ............................... 439/67; 700/121; 438/108

[56] References Cited

U.S. PATENT DOCUMENTS

| | | | |
|---|---|---|---|
| 4,503,386 | 3/1985 | DasGupta et al. | 364/490 |
| 4,703,483 | 10/1987 | Enomoto et al. | 371/24 |
| 4,944,447 | 7/1990 | Thome | 228/104 |
| 5,184,768 | 2/1993 | Hall et al. | 228/104 |
| 5,367,765 | 11/1994 | Kusaka | 29/840 |
| 5,383,787 | 1/1995 | Switky et al. | 439/67 |
| 5,445,311 | 8/1995 | Trask et al. | 228/175 |
| 5,450,206 | 9/1995 | Caillat et al. | 356/394 |
| 5,608,638 | 3/1997 | Tain et al. | 364/468.28 |
| 5,625,297 | 4/1997 | Arnaudov et al. | 324/754 |
| 5,712,793 | 1/1998 | Scepanovic et al. | 364/490 |

OTHER PUBLICATIONS

Myszka et al, A Multichip Package for High–Speed Logic Die, 1992 Proceedings 42nd Electronic Components and Technology Conference, pp. 67–73.

Corless, Recent Developments in Silicon Hybrid Multi–chip Modules, 7th IEEE/CHMT International Electronic Manufacturing Technology Symposium Proceedings 1989, pp. 111–117.

Heinen et al, Multichip Assembly With Flipped Integrated Circuits, IEEE Transactions on Components, Hybrids, and Manufacturing Technology, pp. 672–680, 1989.

*Primary Examiner*—William Grant
*Assistant Examiner*—Chad Rapp

[57] ABSTRACT

A method and apparatus for automatically verifying the design of an IC package is provided. First, data specifying the location of solder balls on the IC device is compared to data specifying the physical location of corresponding pads on the package to determine whether the IC die physically matches the package. Then, data specifying electrical signals associated with the IC die is compared to data specifying electrical signals associated with the package to determine whether the IC die logically matches the package. Finally, data specifying electrical signals associated with pins on the package is compared to data specifying electrical signals associated with a socket to determine whether the package logically matches the socket. If the IC die physically and logically matches the package and if the package logically matches the socket, then the design of the IC package is verified.

9 Claims, 6 Drawing Sheets

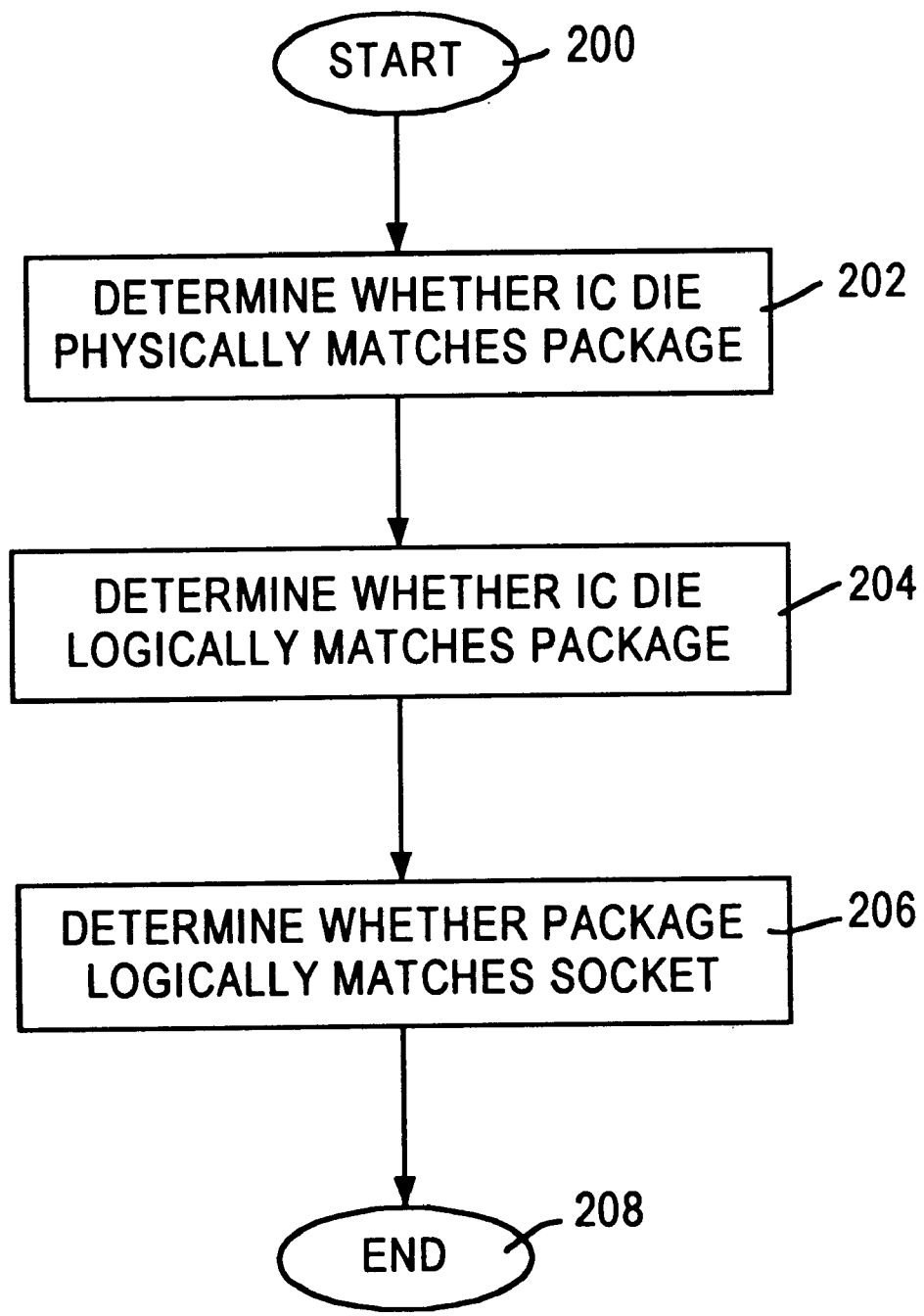

FIG. 3A

| DIE NET LIST ENTRY | SOLDER BALL ID | PHYSICAL LOCATION | SIGNAL ID |

FIG. 3B

| PACKAGE NET LIST ENTRY | PAD ID | PHYSICAL LOCATION | SIGNAL ID | PIN ID |

FIG. 3C

| SOCKET NET LIST ENTRY | HOLE ID | SIGNAL ID | ature
INTEGRATED CIRCUIT PACKAGE VERIFICATION

FIELD OF THE INVENTION

The invention relates to integrated circuits, and more specifically, to a method and apparatus for verifying the design of an integrated circuit (IC) package.

BACKGROUND OF THE INVENTION

One approach for electrically connecting an IC die to the package is the flip-chip mounting approach which allows batch fabrication of connections between the IC die and the package. According to the flip-chip approach, solder balls are first formed on top of the bonding pads on the IC die. Then the IC die is placed face down on a package so that the solder balls on the IC die are aligned with corresponding pads provided on the package. The pads are electrically connected to pins or other electrical connections on the bottom of the package. The IC die is then heated, which causes the solder balls to flow, bonding the IC die to the package and forming the required electrical connections between the IC die and the package.

Consider the flip-chip IC assembly 100 illustrated in FIG. 1. IC assembly 100 includes an IC die 102 and a package 104, which together mate with a socket 106. IC die 102 is cut from a processed wafer and contains a number of circuit devices 108. Electrically conductive solder balls 110, also known as flip-chip bumps, are provided on the bottom of IC die 102 and are electrically connected to circuit devices 108 via electrical connections 112.

In general, package 104 provides electrical connections between circuit devices 108 contained in IC die 102 and socket 106. A number of electrically conductive pads 114 are provided on top of package 104. Pads 114 are physically arranged on package 104 to correspond with the physical arrangement of solder balls 110 to provide electrical connections between IC die 102 and package 104. Pads 114 are electrically connected to an array of electrically conductive pins 116 provided on the bottom of package 104 via electrical connections 118. Pins 116 are arranged on the bottom of package 104 to mate with a series of corresponding holes 120 in socket 106 to provide electrical connections between package 104 and socket 106. When the number of pins 116 becomes large, package 104 can be many times larger than IC die 102. Package 104 can be made from a variety of materials such as plastic, ceramic or other composite material.

The flip-chip approach allows hundreds of bonds between an IC die and package to be formed simultaneously which reduces the time required to fabricate an IC assembly and provides more robust electrical connections between the IC die and package. In addition, the solder balls may be placed anywhere on the surface of the IC die, rather than only around the periphery. This allows a smaller package to be used as well as shorter wire lengths between the solder balls on the IC die and the lead wires on the package.

The flip-chip approach has some challenges. Specifically, the physical location of the solder balls on the IC die must closely match the physical location of the pads on the package to ensure that the desired electrical connections will be made when the IC die is joined with the package. Some deviation between the physical location of a solder ball on an IC die and the physical location of a corresponding pad on the package can result in a misconnection, rendering the package useless. In addition, electrical signals associated with the solder balls on the IC die must match electrical signals associated with the corresponding pads on the package. That is, each solder ball on the IC die must receive the correct electrical signal from its corresponding pad on the package, which in turn is provided to the corresponding pin on the package form the socket.

Current approaches for verifying the design of an IC package involve a manual comparison of solder ball location and signal data to pad location and signal data to verify the physical and logical interfaces between the IC die and the package. Such a manual comparison can be very time consuming, particularly when the number of electrical connections is large, and does not guarantee that the IC die will correctly mate with the package. Often the manual check is supplemented by a physical inspection and experimental testing of the IC after assembly. However, a visual inspection of a flip-chip IC after assembly can be difficult because of the inaccesability to the inner connections between an IC die and the package.

In view of the necessity to verify the design of an IC package prior to IC assembly and the limitations in existing approaches for accomplishing this task, there is a need for an automated approach for verifying the design of an IC package.

SUMMARY OF THE INVENTION

The aforementioned needs are met by, a computer-implemented method for verifying the design of an IC package to be included in an IC assembly. First, a physical interface between an IC die to be included in the IC assembly and the package is verified. Then, a signal interface between the IC die and the package is verified. Finally, a signal interface between the package and a socket to be used with the IC assembly is verified.

According to another aspect of the invention, a computer system is provided for verifying the design of an IC package to be included in an IC assembly. The computer system includes one or more processors and a memory. The memory contains physical interface data, a first set of signal interface data, a second set of signal interface data and a plurality of instructions. The physical interface data is indicative of a physical interface between an IC die to be included in the IC assembly and the package. The first set of signal interface data is indicative of a signal interface between the IC die and the package. The second set of interface data is indicative of the signal interface between the package and the socket to be used with the IC assembly. Finally, the plurality of instructions includes instructions, which when executed by the one or more processors, causes the one or more processors perform the steps of verifying a physical interface between the IC die and the package, verifying a signal interface between the IC die and the package, and finally verifying a signal interface between the package and the socket.

Additional advantages and novel features of the invention will be set forth in part in the description which follows, and in part will become apparent to those skilled in the art upon examination of the following or may be learned by practice of the invention. The advantages of the invention may be realized and attained by means of the instrumentalities and combinations particularly pointed out in the appended claims.

BRIEF DESCRIPTION OF THE DRAWINGS

Embodiments of the invention are illustrated by way of example, and not by way of limitation, in the figures of the accompanying drawings and in which like reference numerals refer to similar elements and in which:

FIG. 2 is a flow chart illustrating a method for verifying the design of an IC package according to an embodiment of the invention;

FIG. 3A illustrates the contents of a die net list entry according to an embodiment of the invention;

FIG. 3B illustrates the contents of a package net list entry according to an embodiment of the invention;

FIG. 3C illustrates the contents of a socket net list entry according to an embodiment of the invention;

DETAILED DESCRIPTION OF THE PREFERRED EMBODIMENT

Figure 1:
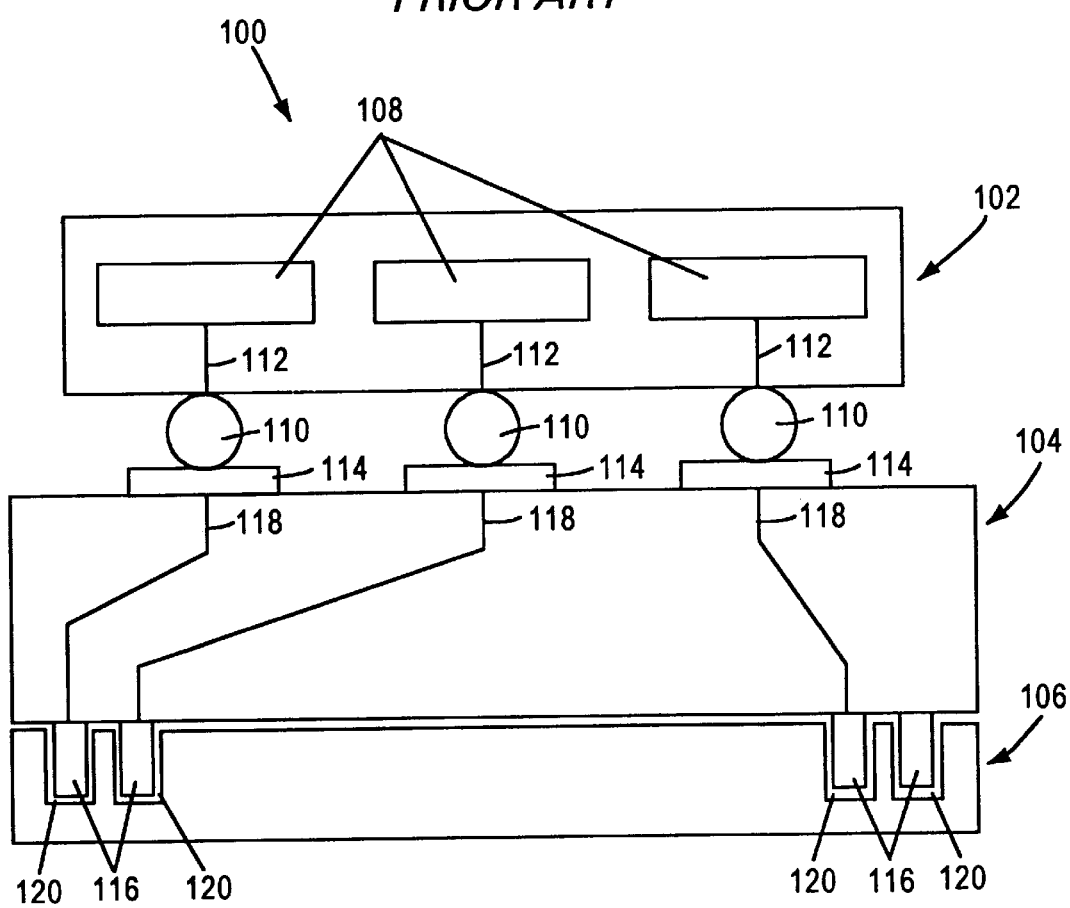
FIG. 1 illustrates a flip-chip IC.

The invention provides an automated approach for verifying the design of an IC package to be included in an IC assembly. In the following description, for the purposes of explanation, specific details are set forth in order to provide a thorough understanding of the invention. However, it will be apparent that the invention may be practiced without these specific details. In other instances, well known structures and devices are depicted in block diagram form in order to avoid unnecessarily obscuring the invention.

FUNCTIONAL OVERVIEW

Generally, verifying the design of an IC package according to an embodiment of the invention involves verifying an interface between an IC die to be included in the IC assembly and the package by performing both a physical matching and a logical matching of the IC die to the package.

Performing a physical matching involves comparing data which specifies the physical location of solder balls on the IC die to data which specifies the physical location of corresponding pads on the package to determine whether the IC die physically matches the package. Performing a logical matching involves two phases. First, data which specifies signals associated with the solder balls on the IC die is compared to data which specifies signals associated with the pads on the package to determine whether the IC die logically matches the package. Then, data which specifies signals associated with pins on the package is compared to data which specifies signals associated with holes on the socket to determine whether the package logically matches the socket. If the IC die both physically and logically matches the package, and if the package logically matches the socket, then the design of the IC package is verified.

This approach ensures that if the IC die and package are fabricated according to the data used in the physical and logical matching, that each solder ball on the IC die will be physically aligned with its corresponding pad on the package and also that a signal associated with each solder ball on the IC die will match a corresponding signal on the socket.

The top level approach for verifying the design of an IC package according to an embodiment of the invention is illustrated by the flow chart of FIG. 2. After starting in step 200, in step 202 a determination is made as to whether the IC die physically matches the package. As previously discussed, this involves determining whether the physical location of each solder ball on the IC die corresponds to the physical location of a corresponding pad on the package.

In step 204 a determination is made as to whether the IC die logically matches the package. As previously discussed, this involves verifying whether data indicative of a signal associated with each solder ball on the die matches data indicative of a signal associated with the corresponding pad on the package.

Then in step 206, a determination is made as to whether the package logically matches the socket. As previously discussed, this involves verifying that data indicative of a signal associated with each pin on the package matches data indicative of a signal associated with the corresponding hole in the socket. The process is then complete in step 208.

DETAILED DESCRIPTION

According to an embodiment of the invention, the information required by the physical matching checks and logical matching checks is maintained in three types of data lists which include: a) a die net list; b) a package net list; and c) a socket net list.

a) Die Net List

The die net list contains information which specifies both a physical location and an electrical signal associated with each solder ball on an IC die. According to one embodiment of the invention, the die net list is organized as a series of die net list entries. Each die net list entry corresponds to a particular solder ball and as illustrated in FIG. 3A, includes a solder ball ID, a physical location and a signal ID.

The solder ball ID is information which uniquely identifies a solder ball. According to one embodiment of the invention, the solder ball ID is based upon a row ID and a column ID location from an IC die matrix. This may include, for example, an alphanumeric code, such as "AB27" or "X13".

The physical location specifies the physical location of the solder ball on the IC die, in die X,Y coordinates. For example, the physical location may be in the form of two numbers, such as integer, floating point or real, corresponding to the X and Y coordinates.

The signal ID specifies an ID of an electrical signal associated with the solder ball. According to one embodiment of the invention, the signal ID is an alphanumeric code, for example, "VCC", "GND" or "Q76". Although specific examples of the solder ball ID, physical location and signal ID have been provided, other representations may be used without departing from the scope of the invention.

b) Package Net List

The package net list contains information which specifies pad ID, a physical location, an associated electrical signal and a corresponding pin for each pad on a package. According to one embodiment of the invention, the package net list is organized as a series of package net list entries. As illustrated in FIG. 3B, each package net list entry corresponds to a pad and electrically connected pin on the package and includes a pad ID, a physical location, a signal ID and a pin ID.

The pad ID is information which uniquely identifies a pad on the package.

According to one embodiment of the invention, the pad ID is based upon a row ID and a column ID location from a package matrix. This may include, for example, an alphanumeric code, such as "ER 47" or "B 19", in a format matching the format of the solder ball IDs.

The physical location specifies the physical location of the pad on the package in X, Y coordinates. For example, the physical location may be in the form of two numbers such as integer, floating point or real, corresponding to the X and Y coordinates.

The signal ID specifies an ID of an electrical signal associated with the pad. According to one embodiment of the invention, the signal ID is an alphanumeric code, for example, "VCC", "GND" or "Q76". The format or protocol for these signal IDs is the same as is used for the signal IDs associated with the solder balls.

The pin ID identifies a particular pin on the package which is electrically connected to the pad. According to one embodiment of the invention, the pin ID is a three or four character alphanumeric code, such as "D47" or "EF 12". Although specific examples of the pad ID, physical location, signal ID and pin ID have been provided, other representations may be used without departing from the scope of the invention.

c) Socket Net List

The socket net list contains information which specifies an electrical signal associated with each hole on the socket. According to one embodiment of the invention, the socket net list is organized as a series of socket net list entries. As illustrated in FIG. 3C, each socket net list entry corresponds to a socket hole and includes a hole ID and a signal ID.

The hole ID identifies a particular hole on the socket which is mated with a corresponding pin on the package. According to one embodiment of the invention, the hole ID is an alphanumeric code, such as "E32" or "FM47" in a format matching the format of the pin IDs.

The signal ID specifies an ID of an electrical signal associated with the socket hole. According to one embodiment of the invention, the signal ID is a three character alphanumeric code, of the same format as for the signal IDs of the solder balls and the pads, for example, "VCC", "GND" or "Q76". Although specific examples of the hole ID and the signal ID have been provided, other representations may be used without departing from the scope of the invention.

For purposes of describing embodiments of the invention, the die net list, the package net list, and the socket net lists are illustrated as three separate lists. However, the data contained in these three lists may be combined in any manner, in any number of lists, without departing from the scope of the invention. In addition, although embodiments of the invention are described in the context of a pin grid array (PGA), the invention is also applicable to other arrangements, for example ball grid array (BGA) in which pins 116 are balls and sockets 120 are landing pads.

1. PHYSICAL MATCHING

As previously discussed, determining whether a IC die physically matches a corresponding IC package involves checking whether the physical coordinates of each solder ball on the IC die match the physical coordinates of the corresponding pad on the package. According to one embodiment of the invention, physical location information contained in an entry in the die net list for a solder ball on the IC die is compared to physical location information contained in an entry in the package net list for the pad on the package which corresponds to the solder ball. However, a direct comparison of the raw data does not always provide a true indication of whether these locations specify the same location because of differences in coordinate systems for the IC die and package. For example, a die designer may select the lower-left corner of an IC die as the origin (0,0), while a package designer may select the center of the package as the origin (0,0). Consequently, the physical location information from the die net list and package net list is first normalized to account for any differences between die coordinates and package coordinates before the comparison is made.

According to one embodiment of the invention, the normalization of the physical location data accounts for: a) flipping of the IC die with respect to the package (mirror coordinates); b) orientation of the IC die with respect to the package; c) differences in scaling between die coordinates and package coordinates; and d) differences in the location of the reference point for the IC die and the package. Each of these factors is described separately below.

a) Flipping of the IC Die With Respect to the Package (Mirror Coordinates)

Often die coordinates are referenced from the top of the IC die to which the solder balls are attached. Since during assembly of a flip-chip IC the IC die is inverted so that the solder balls are facing the pads on the top of the package, the die coordinates are also flipped with respect to the package. Consequently, to the extent the flipping of the IC die with respect to the package affects the relationship between die coordinates and package coordinates, the physical location data is adjusted to account for any differences between die coordinates and package coordinates induced by the flipping of the IC die during assembly.

b) Orientation of the IC Die With Respect to the Package

Die coordinates typically specify that the +X and +Y directions are with respect to a particular orientation which may not be the orientation of the IC die after being attached to the package. For example, given an origin (0,0) in the middle of the IC die, the +X and +Y directions may be based upon a horizontal orientation of the IC die. Therefore, if the IC die is oriented differently on the package, then the effect on the die coordinates relative to package coordinates must be accounted for when the data is normalized before the die net list data is compared to the package net list data.

c) Differences in Scaling Between Die Coordinates and Package Coordinates

Any differences in scaling between die coordinates and package coordinates must be accounted for when the data is normalized before the die net list data is compared to the package net list data. For example, in some applications the die net list data may be in microns while the package net list data may be inches.

d) Differences in the Location of the Reference Point Between Die Coordinates and Package Coordinates The IC die and package may have different reference points for their respective origins which must be accounted for before the physical location data from the die net list can be compared to the physical location data from the package net list. For example, the origin (0,0) for the IC die may be the lower left-hand corner of the IC die while the origin (0,0) for the package may be the center of the package.

2. LOGICAL MATCHING

As previously discussed, verifying the interface between a IC die and a package includes determining whether the die signals logically match the package signals and also determining whether the package signals logically match the socket signals.

According to one embodiment of the invention, determining whether the die signal for a solder ball logically matches the package signal for the corresponding pad involves comparing the signal ID contained in the die net list entry for the solder ball to the signal ID contained in the package net list entry for the corresponding pad. For example, for a particular solder ball having solder ball ID of "AB27" the signal ID may be "VCC." The package net list entry containing a pad ID of "AB27" is located and if the signal ID contained in that entry is also "VCC", then the die signal associated with solder ball "AB27" logically matches the package pad having a pad ID of "AB27."

According to one embodiment of the invention, the same approach is used to determine whether the package signals logically match the socket signals. For each package pin, the pin ID is used to look up the signal ID for that package pin in the package net list. Then socket net list is used to look up the signal ID for the socket hole having the same hole ID. The two signal IDs are then compared to determine whether the package pin logically matches the corresponding socket hole. For example, a pin ID of "P43" is read from the package net list entry having a signed ID of "VCC". This pin ID is then compared to the hole IDs contained in the socket net list. Once this entry is located, the signal ID in that socket net list entry is checked to see if it is also "VCC". If so, then the pin signal associated with pin "P43" matches the socket hole having a hole ID of "P43."

The top level approach for verifying the design of an IC package with respect to a single solder ball and a single pad, according to an embodiment of the invention, is now described with reference to the flow chart of FIGS. 4A and 4B.

After starting at step 400, in step 402 the die net list is searched to locate the die net list entry corresponding to the selected solder ball. This is done by comparing the ID of the solder ball to the solder ball IDs contained in each die net list entry. Once the die net list entry has been located for this solder ball, then in step 404, the physical location data and signal ID data are read from the die net list entry.

In step 406 the package net list is searched to locate the package net list entry for a pad which corresponds to the solder ball. According to one embodiment of the invention, the pad which corresponds to the solder ball has a pad ID which is the same as the solder ball ID for the corresponding solder ball. Accordingly, the package net list is searched to locate the package net list entry having a pad ID which matches the solder ball ID. However, other approaches for providing a correspondence between a solder ball and corresponding pad may be used without departing from the scope of the invention. For example, a lookup table may be used to specify the pad ID of a pad which corresponds to a particular solder ball based upon the solder ball ID.

Once the package net list entry for the corresponding pad has been located, the physical location data, signal ID data and pin ID data are read from the package net list entry in step 408. Then, in step 410, the position location data for the solder ball and the corresponding pad are normalized. As previously described, normalizing the physical location data for a solder ball and corresponding pad involves adjusting the data to account for the flipping of the IC die with respect to the package, the orientation of the IC die with respect to the package, differences in scaling between die coordinates and package coordinates and also the differences in location of the reference point for the IC die and the package. However, depending upon a particular IC construction, other factors may also be considered without departing from the scope of the invention.

Once the physical location data for the solder ball and the corresponding pad have been normalized, then in step 412, the normalized physical location data for the solder ball is compared to the normalized physical location data for the corresponding pad. In step 414, a determination is made as to whether the normalized physical location data for the solder ball matches the normalized physical location data for the corresponding pad. According to one embodiment of the invention, a predetermined tolerance is used to determine whether the normalized physical location data for the solder ball matches the normalized physical location data for the corresponding pad. The predetermined tolerance is based upon an acceptable deviation in physical location which still ensures an electrical connection after the IC die is bonded to the package.

If in step 414 the normalized physical location data does not match, then in step 415 the physical mismatch is recorded. According to one embodiment of the invention, the physical mismatch is recorded in a data file which can be later used to correct the data. On the other hand, if in step 414, the normalized physical location data matches, then in step 416, the signal ID data previously read from the die net list is compared to the signal ID data read from the package net list.

In step 418, a determination is made as to whether the signal ID data from the die net list matches the signal ID data from the package net list. If not, then in step 420 the mismatch is recorded in a data file to be used later on to remedy the logical mismatch between the solder ball and the pad. If however, the data does match, then the solder ball logically matches the corresponding pad. Then in 424, the socket net list is searched to locate the socket net list entry for a socket hole corresponding to the pin in the package which is electrically connected to the pad. According to one embodiment of the invention, the hole ID for a socket hole which corresponds to a package pin is identical to the pin ID for the corresponding socket pin. However, other approaches may be used for determining the corresponding hole for a particular socket without departing from the scope of the invention. For example, a lookup table may be used to specify the hole ID for a hole corresponding to a particular socket pin. Then the socket net list entry containing this hole ID can be easily located.

Once the socket net list entry for the socket hole corresponding to the pin has been located, then the signal ID data for the socket hole is read from the socket net list in step 426. In step 428, the signal ID data from the package net list is compared to the signal ID data from the entry in the socket net list. Then, in step 430, a determination is made as to whether the signal ID data from the package net list matches the signal ID data from the socket net list. If not, then in step 431 the logical mismatch between the package pin and the corresponding socket is recorded in a data file to be used later to remedy the logical mismatch. On the other hand, If the data does match, then the package pin logically matches the corresponding hole in the socket.

Figure 4A:
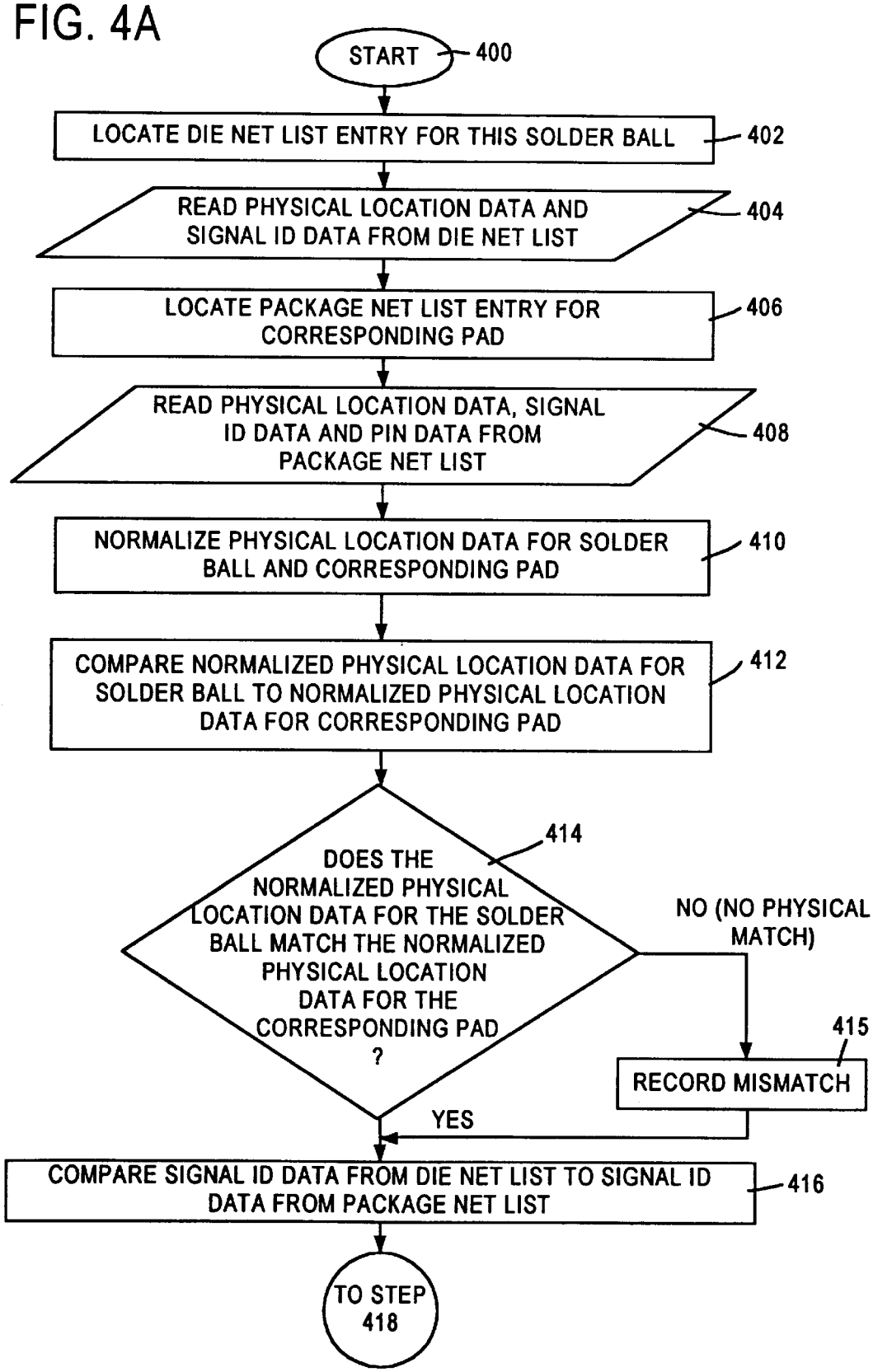
FIGS. 4A and 4B comprise a flow chart which illustrates a method for determining whether an IC die solder ball physically and logically matches a corresponding pad on a package in an IC according to an embodiment of the invention.
Figure 4B:
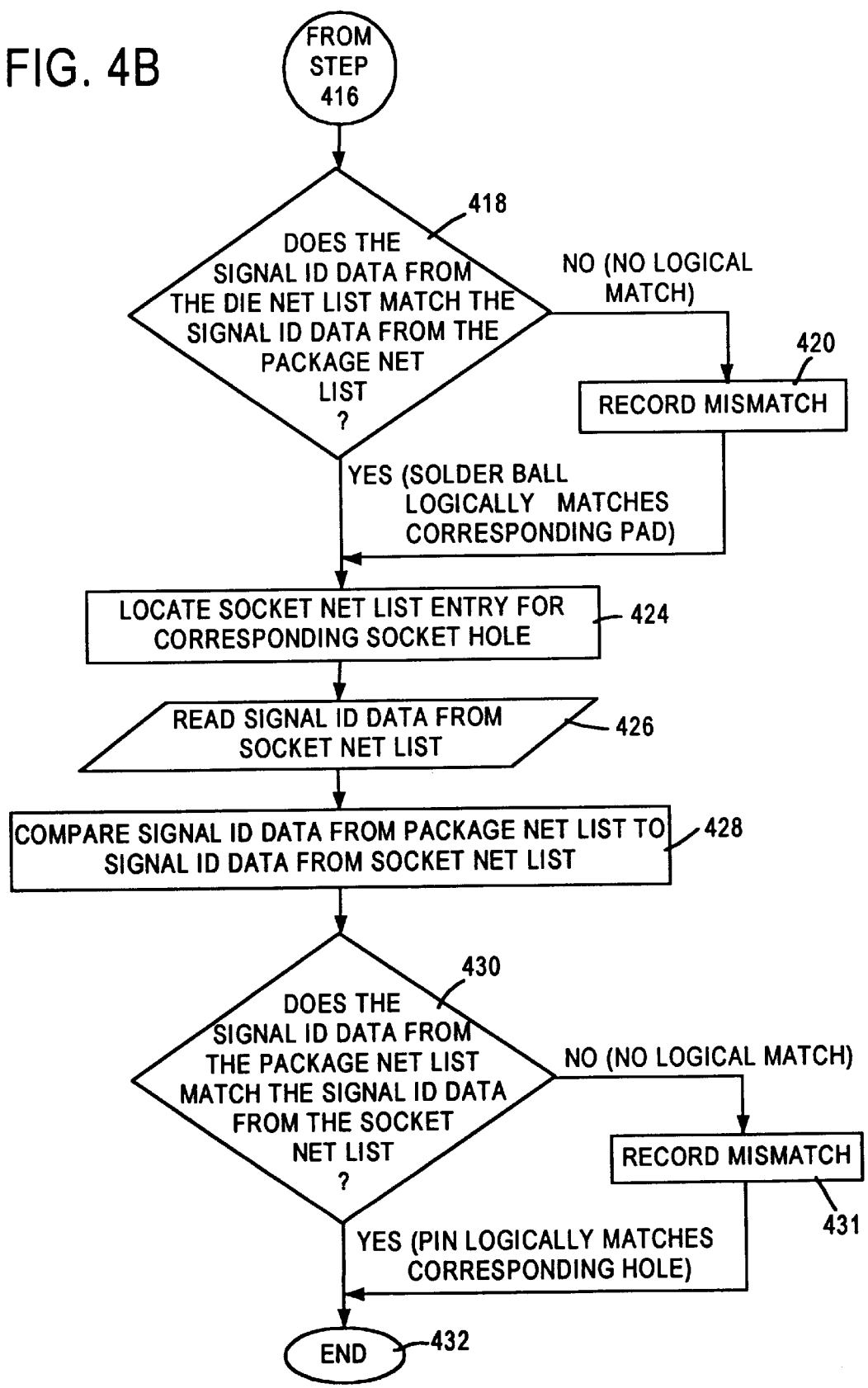

The process described in FIGS. 4A and 4B is repeated for all of the solder balls from the IC die and the results are stored in a data file to report any mismatches which occurred during the physical and logical matching. However, the results of the tests may be reported in other formats without departing from the scope of the invention.

On the other hand, if in step 414 the physical location data for the solder ball does not match the physical location data for the corresponding pad, then the solder ball does not physically match the corresponding pad. In addition, if in step 418 the signal ID data from the die net list does not match the signal ID data from the package net list or if in step 430 the signal ID data from the package net list does not match the signal ID data from the socket net list, then the solder ball does not logically match the corresponding pad and the process is complete in step 432.

HARDWARE OVERVIEW

Figure 5:
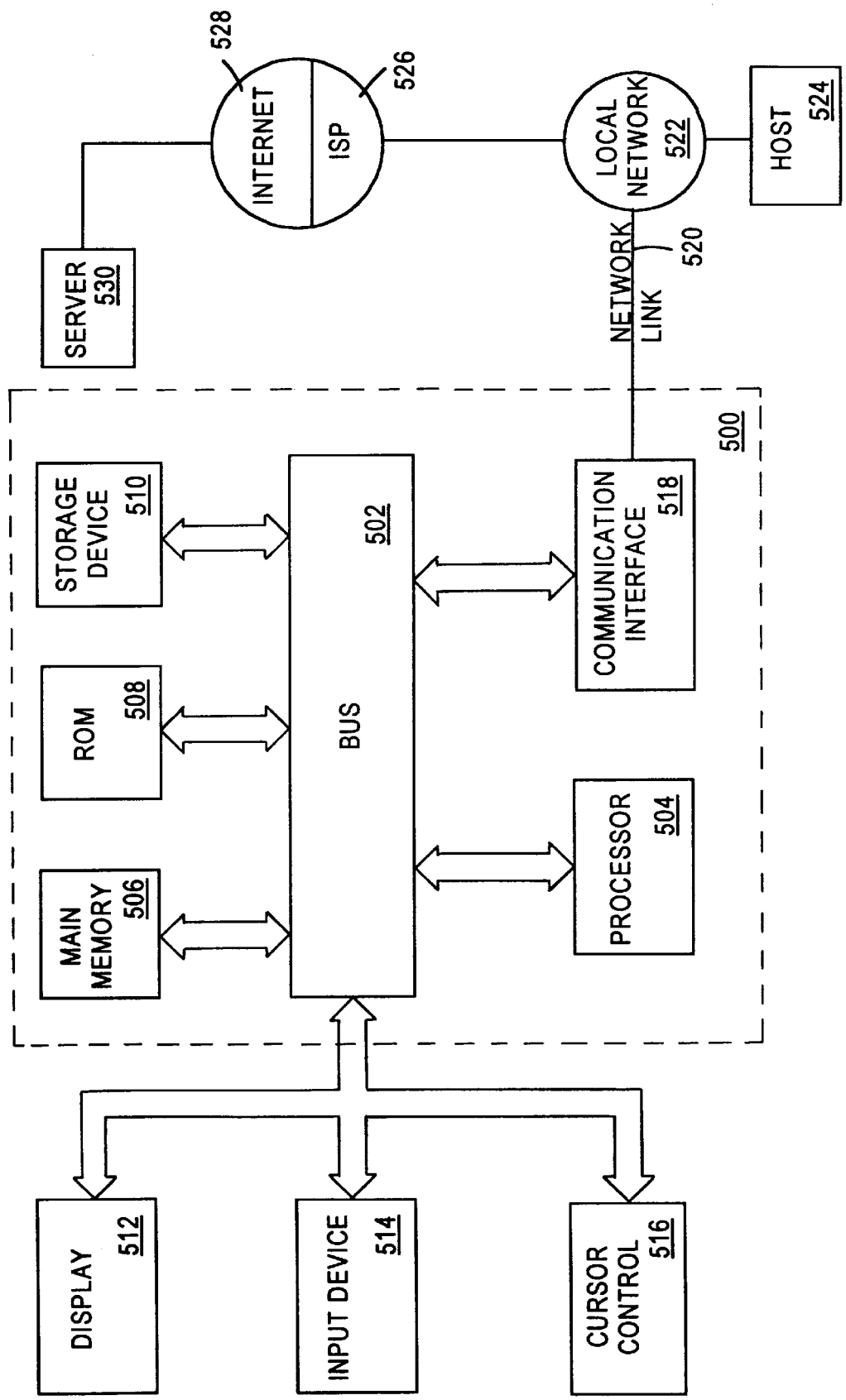
FIG. 5 is a block diagram of a computer system on which embodiments of the invention may be implemented.

FIG. 5 is a block diagram which illustrates a computer system 500 upon which an embodiment of the invention may be implemented. Computer system 500 includes a bus 502 or other communication mechanism for communicating information, and a processor 504 coupled with bus 502 for processing information. Computer system 500 also includes a main memory 506, such as a random access memory (RAM) or other dynamic storage device, coupled to bus 502 for storing information and instructions to be executed by processor 504. Main memory 506 also may be used for storing temporary variables or other intermediate information during execution of instructions by processor 504. Computer system 500 also includes a read only memory (ROM) 508 or other static storage device coupled to bus 502 for storing static information and instructions for processor 504. A storage device 510, such as a magnetic disk or optical disk, is also provide and coupled to bus 502 for storing information and instructions.

Computer system 500 may also be coupled via bus 502 to a display 512, such as a cathode ray tube (CRT), for displaying information to a computer user. An input device 514, including alphanumeric and other keys, is also provided and coupled to bus 502 for communicating information and command selections to processor 504. Another type of user input device is cursor control 516, such as a mouse, a trackball, or cursor direction keys for communicating direction information and command selections to processor 504 and for controlling cursor movement on display 512. This input device typically has two degrees of freedom in two axes, a first axis (e.g., x) and a second axis (e.g., y), which allows the device to specify positions in a plane.

The invention is related to the use of computer system 500 to automatically verify the design of an IC package to be included in an IC assembly. According to one embodiment of the invention, the automatic verification of the design of an IC package is provided by computer system 500 in response to processor 504 executing sequences of instructions contained in main memory 506. Such instructions may be read into main memory 506 from another computer-readable medium, such as storage device 510. However, the computer-readable medium is not limited to devices such as storage device 510. For example, the computer-readable medium may include a floppy disk, a flexible disk, hard disk, magnetic tape, or any other magnetic medium, a CD-ROM, any other optical medium, a RAM, a PROM, and EPROM, a FLASH-EPROM, any other memory chip or cartridge, or any other medium from which a computer can read. Execution of the sequences of instructions contained in main memory 506 causes processor 504 to perform the process steps previously described. In alternative embodiments, hard-wired circuitry may be used in place of or in combination with software instructions to implement the invention. Thus, embodiments of the invention are not limited to any specific combination of hardware circuitry and software.

Computer 500 also includes a communication interface 518 coupled to bus 502. Communication interface 508 provides a two-way data communication coupling to a network link 520 to a local network 522. For example, if communication interface 518 is an integrated services digital network (ISDN) card or a modem, communication interface 518 provides a data communication connection to the corresponding type of telephone line. If communication interface 518 is a local area network (LAN) card, communication interface 518 provides a data communication connection to a compatible LAN. Wireless links are also possible. In any such implementation, communication interface 518 sends and receives electrical, electromagnetic or optical signals which carry digital data streams representing various types of information.

Network link 520 typically provides data communication through one or more networks to other data devices. For example, network link 520 may provide a connection through local network 522 to a host computer 524 or to data equipment operated by an Internet Service Provider (ISP) 526. ISP 526 in turn provides data communication services through the world wide packet data communication network now commonly referred to as the "Internet" 528. Local network 522 and Internet 528 both use electrical, electromagnetic or optical signals which carry digital data streams. The signals through the various networks and the signals on network link 520 and through communication interface 518, which carry the digital data to and from computer 500 are exemplary forms of carrier waves transporting the information.

Computer 500 can send messages and receive data, including program code, through the network(s), network link 520 and communication interface 518. In the Internet example, a server 530 might transmit a requested code for an application program through Internet 528, ISP 526, local network 522 and communication interface 518. In accordance with the invention, one such downloaded application is the integrated circuit package verification software described herein.

The received code may be executed by processor 504 as it is received, and/or stored in storage device 510, or other non-volatile storage for later execution. In this manner, computer 500 may obtain application code in the form of a carrier wave.

Although embodiments of the invention have been described in the context of a flip-chip IC having solder balls on the flip-chip and pads on the package, the invention is applicable to any flip-chip IC configuration, such as packages having solder balls and flip-chip with pads or even multi-die ICs, and is also applicable to ICs other than flip-chip ICs, for example, wire bond packages.

The invention provides package design errors attributable to physical and logical mismatches between the IC die and the package and logical mismatches between the package and the socket are eliminated. Specifically, several advantages over prior approaches for verifying the design of an IC package. First, the physical matching ensures that the solder bumps on an IC die will be aligned with the pads on a corresponding IC package so long as the IC die is properly aligned with the IC package. In addition, the logical matching ensures that electrical signals associated with the solder bumps on the IC die will match the electrical signals associated with corresponding pads on the IC package, electrical signals associated with the pins on the IC package and also electrical signals associated with holes in the socket which receive the IC package pins.

As a result, this approach eliminates both human errors inherent in manual data checking and the need for a visual inspection of the interface between an IC die and a corresponding IC package after an IC has been assembled. Also, this approach provides for the verification of the design of an IC package prior to the fabrication of the IC package while providing significant reduction in design cycle time.

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. A method for verifying the design of an integrated circuit (IC) package in an IC assembly, the method comprising the computer-implemented steps of:

verifying a physical interface between an IC die to be included in the IC assembly and the package;

verifying a signal interface between the IC die and the package by determining whether a die signal identifier matches a package signal identifier, wherein the die signal identifier is indicative of an electrical signal associated with an electrical connector on the IC die and wherein the package signal identifier is indicative of an electrical signal associated with an electrical connector on the package; and verifying a signal interface between the package and a socket to be used with the IC assembly.

2. A method for verifying the design of an integrated circuit (IC) package in an IC assembly, the method comprising the computer-implemented steps of:

verifying a physical interface between an IC die to be included in the IC assembly and the package;

verifying a signal interface between the IC die and the package; and verifying a signal interface between the package and a socket to be used with the IC assembly by determining whether a package signal identifier matches a socket signal identifier, wherein the package signal identifier is indicative of an electrical signal associated with an electrical connector on the package and wherein the socket signal identifier is indicative of an electrical signal associated with an electrical connector on the package.

3. A method for verifying the design of an integrated circuit (IC) package in an IC assembly, the method comprising the computer-implemented steps of:

verifying a physical interface between an IC die to be included in the IC assembly and the package by determining whether a set of die connector location data corresponds to a set of package connector location data, wherein the die connector location data is indicative of the physical location of a set of electrical conductors associated with the IC die and the package connector location data is indicative of the physical location of a first set of electrical conductors associated with the package;

verifying a signal interface between the IC die and the package by determining whether a set of die connector signal data corresponds to a first set of package connector signal data, wherein the set of die connector signal data is indicative of data signals associated with the set of electrical conductors associated with the IC die and the first set of package connector signal data is indicative of data signals associated with the first set of electrical conductors associated with the package; and verifying a signal interface between the package and a socket to be used with the IC assembly by determining whether a second set of package connector signal data corresponds to a set of socket signal data, the second set of package connector signal data being indicative of data signals associated with the a second set of electrical conductors associated with the package, the set of socket signal data being indicative of data signals associated with a set of electrical conductors associated with the socket.

4. The method as recited in claim 3, further including the steps of normalizing the set of die connector location data, and normalizing the set of package connector location data.

5. A computer-readable medium carrying one or more sequences of one or more instructions for verifying the design of an integrated circuit (IC) package in an IC assembly, the one or more sequences of one or more instructions including instructions which, when executed by one or more processors, cause the one or more processors to perform the steps of:

verifying a physical interface between an IC die to be included in the IC assembly and the package;

verifying a signal interface between the IC die and the package by determining whether a die signal identifier matches a package signal identifier, wherein the die signal identifier is indicative of an electrical signal associated with an electrical connector on the IC die and wherein the package signal identifier is indicative of an electrical signal associated with an electrical connector on the package; and verifying a signal interface between the package and a socket to be used with the IC assembly.

6. A computer-readable medium carrying one or more sequences of one or more instructions for verifying the design of an integrated circuit (IC) package in an IC assembly, the one or more sequences of one or more instructions including instructions which, when executed by one or more processors, cause the one or more processors to perform the steps of:

verifying a physical interface between an IC die to be included in the IC assembly and the package;

verifying a signal interface between the IC die and the package; and verifying a signal interface between the package and a socket to be used with the IC assembly by determining whether a package signal identifier matches a socket signal identifier, wherein the package signal identifier is indicative of an electrical signal associated with an electrical connector on the package and wherein the socket signal identifier is indicative of an electrical signal associated with an electrical connector on the package.

7. A computer-readable medium carrying one or more sequences of one or more instructions for verifying the design of an integrated circuit (IC) package in an IC assembly, the one or more sequences of one or more instructions including instructions which, when executed by one or more processors, cause the one or more processors to perform the steps of:

verifying a physical interface between an IC die to be included in the IC assembly and the package by determining whether a set of die connector location data corresponds to a set of package connector location data, wherein the die connector location data is indicative of the physical location of a set of electrical conductors associated with the IC die and the package connector location data is indicative of the physical location of a first set of electrical conductors associated with the package;

verifying a signal interface between the IC die and the package by determining whether a set of die connector signal data corresponds to a first set of package connector signal data, wherein the set of die connector signal data is indicative of data signals associated with the set of electrical conductors associated with the IC die and the first set of package connector signal data is indicative of data signals associated with the first set of electrical conductors associated with the package; and verifying a signal interface between the package and a socket to be used with the IC assembly by determining whether a second set of package connector signal data corresponds to a set of socket signal data, the second set of package connector signal data being indicative of data signals associated with the a second set of electrical conductors associated with the package, the set of socket signal data being indicative of data signals associated with a set of electrical conductors associated with the socket.

8. The computer-readable medium as recited in claim 7, further including instructions which when, executed by the one or more processors, cause the one or more processors to perform the steps of normalizing the set of die connector location data, and normalizing the set of package connector location data.

9. A computer system for verifying the design of an integrated circuit (IC) package in an IC assembly, the computer system including one or more processors and a memory containing:

a) physical interface data indicative of a physical interface between an IC die to be included in the IC assembly and the package, wherein the physical interface data includes i) a set of die connector location data indicative of the physical location of a set of electrical conductors associated with the IC die, and ii) a set of package connector location data indicative of the physical location of a first set of electrical conductors associated with the package;

b) a first set of signal interface data indicative of a signal interface between the IC die and the package, wherein the first set of signal interface data includes i) a set of die connector signal data indicative of signals associated with each of the set of electrical conductors associated with the IC die, and ii) a first set of package connector signal data indicative of signals associated with each of the first set of electrical conductors associated with the package;

c) a second set of signal interface data indicative of a signal interface between the package and a socket to be used with the IC assembly, wherein the second set of signal interface data includes i) a second set of package connector signal data indicative of signals associated with a second set of electrical conductors associated with the package, and ii) a set of socket connector signal data indicative of signals associated with a set of electrical conductors associated with the socket; and d) a plurality of instructions which when executed by the one or more processors cause the one or more processors to perform the steps of i) verify a physical interface between the IC die and the package, ii) verify a signal interface between the IC die and the package, and iii) verify a signal interface between the package and the socket.

* * * * *